US006990721B2

(12) United States Patent
Mariano et al.

(10) Patent No.: US 6,990,721 B2
(45) Date of Patent: Jan. 31, 2006

(54) GROWTH MODEL AUTOMATED MATERIAL HANDLING SYSTEM

(75) Inventors: Thomas R. Mariano, Londonderry, NH (US); Timothy A. McCabe, Nashua, NH (US); Carl Johnson, Milford, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/393,728

(22) Filed: Mar. 21, 2003

(65) Prior Publication Data

US 2004/0181929 A1 Sep. 23, 2004

(51) Int. Cl.
*B23P 21/00* (2006.01)
*B65G 49/07* (2006.01)

(52) U.S. Cl. .......................... 29/469; 29/563; 29/824; 414/935; 414/940

(58) Field of Classification Search .................. 29/469, 29/563, 650, 700, 729, 823, 824; 414/278, 414/279, 935, 940
See application file for complete search history.

(56) References Cited

U.S. PATENT DOCUMENTS

| | | | | |
|---|---|---|---|---|
| 3,543,392 A | * | 12/1970 | Bomkamp et al. | 29/563 |
| 3,889,355 A | * | 6/1975 | Aronstein et al. | 29/25.01 |
| 3,946,484 A | * | 3/1976 | Aronstein et al. | 29/25.01 |
| 3,976,330 A | * | 8/1976 | Babinski et al. | 406/84 |
| 4,027,246 A | * | 5/1977 | Caccoma et al. | 700/121 |
| 4,211,505 A | * | 7/1980 | Babinski et al. | 406/19 |
| 4,278,366 A | * | 7/1981 | Loveless et al. | 406/88 |
| 4,369,563 A | * | 1/1983 | Williamson | 483/7 |
| 4,564,102 A | * | 1/1986 | Mori et al. | 198/341.03 |
| 5,228,820 A | * | 7/1993 | Stansfield et al. | 414/278 |
| 5,239,739 A | * | 8/1993 | Akeel et al. | 29/430 |
| 5,388,945 A | * | 2/1995 | Garric et al. | 414/217.1 |
| 5,443,346 A | * | 8/1995 | Murata et al. | 414/222.13 |
| 5,803,972 A | * | 9/1998 | Sato et al. | 118/712 |
| 5,924,833 A | * | 7/1999 | Conboy et al. | 414/217 |
| 5,980,183 A | * | 11/1999 | Fosnight | 414/222.01 |
| 6,223,886 B1 | * | 5/2001 | Bonora et al. | 198/465.2 |
| 6,235,634 B1 | * | 5/2001 | White et al. | 438/680 |
| 6,308,818 B1 | * | 10/2001 | Bonora et al. | 198/465.1 |
| 6,336,546 B1 | * | 1/2002 | Lorenz | 198/346.2 |
| 6,481,558 B1 | * | 11/2002 | Bonora et al. | 198/346.2 |
| 6,519,502 B2 | * | 2/2003 | Chao | 700/213 |
| 6,572,321 B1 | * | 6/2003 | Nulman | 414/416.05 |
| 6,580,967 B2 | * | 6/2003 | Jevtic et al. | 700/228 |
| 6,591,488 B1 | * | 7/2003 | Tachibana | 29/783 |
| 6,594,546 B2 | * | 7/2003 | Elger | 700/225 |

(Continued)

*Primary Examiner*—Essama Omgba
(74) *Attorney, Agent, or Firm*—Perman & Green, LLP; Richard Pickreign

(57) ABSTRACT

A method for installing an automated material handling system in a semiconductor fabrication facility capable of accommodating a predetermined number of fabrication bays. The handling system has a set of elements including material storage, interbay transport, and intrabay transport elements corresponding to the predetermined number of fabrication bays. The method comprises arranging at least some of the material storage, interbay transport and intrabay transport elements into handling system subsets, and installing one or more of the subsets into the fabrication facility. Each subset has at least one or more corresponding ones of the material storage, interbay transport and intrabay transport elements so that when installed each subset forms a transport circuit allowing substantially unrestricted bi-directional travel of semiconductor device holders between the material storage and at least one of the fabrication bays. The installation of one or more of the subsets into the fabrication facility is accomplished before installation of any element other of the handling system subsets.

30 Claims, 11 Drawing Sheets

U.S. PATENT DOCUMENTS

| | | | |
|---|---|---|---|
| 6,623,231 B2 * | 9/2003 | Elger | 414/331.01 |
| 6,745,102 B1 * | 6/2004 | Liu | 700/228 |
| 6,745,454 B1 * | 6/2004 | Grimshaw et al. | 29/563 |
| 6,821,082 B2 * | 11/2004 | McGowan | 414/805 |
| 6,845,294 B2 * | 1/2005 | Jevtic et al. | 700/228 |
| 6,851,913 B2 * | 2/2005 | Iizuka | 414/626 |
| 6,877,944 B2 * | 4/2005 | Peiter | 414/279 |
| 6,887,358 B2 * | 5/2005 | Elger | 204/298.35 |
| 2003/0198540 A1 * | 10/2003 | Lin et al. | 414/217 |
| 2003/0235486 A1 * | 12/2003 | Doherty et al. | 414/217.1 |
| 2005/0119787 A1 * | 6/2005 | Huang et al. | 700/230 |

\* cited by examiner

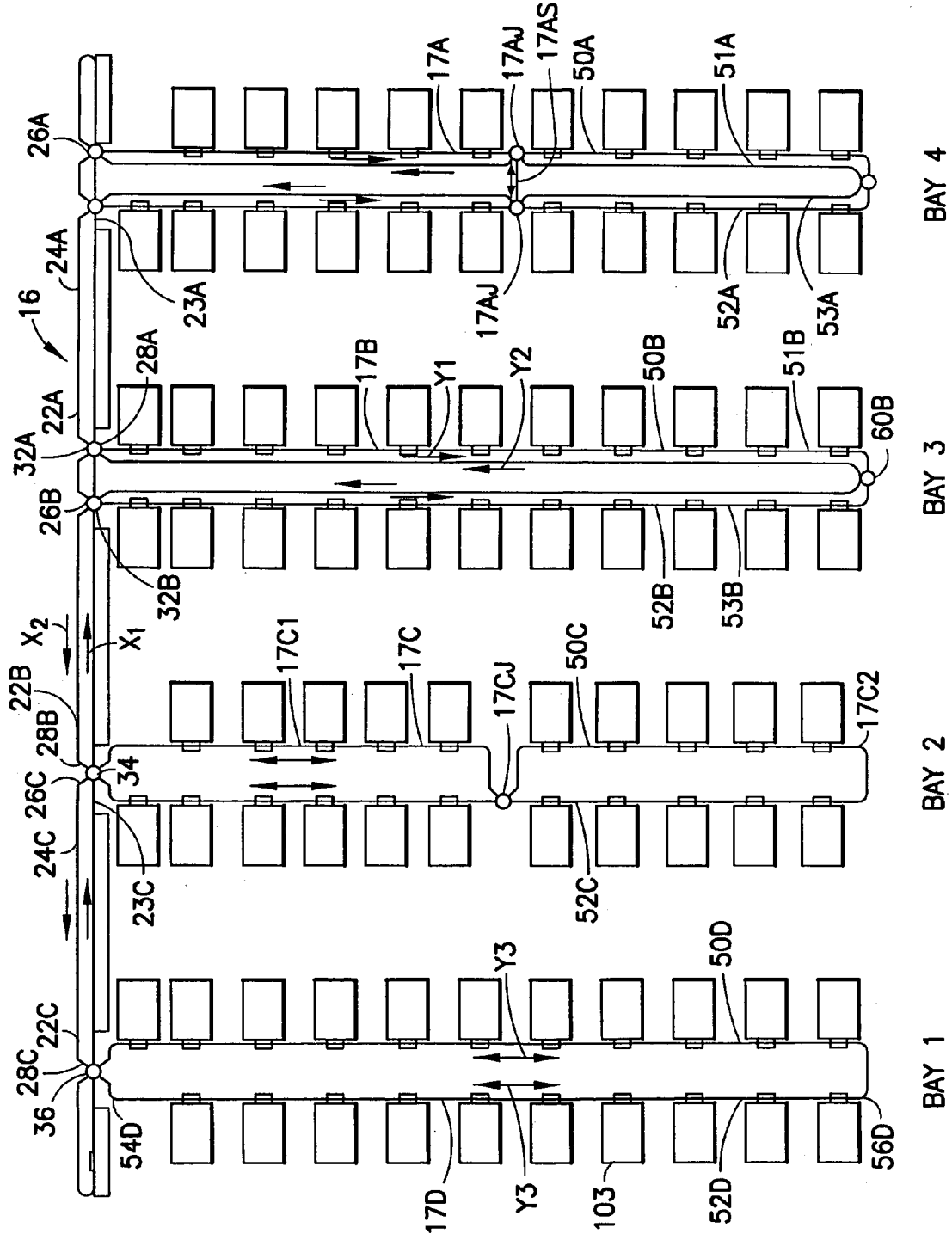

GROWTH MODEL AUTOMATED MATERIAL HANDLING SYSTEM

BACKGROUND OF THE INVENTION

1. Field of the Invention

The present invention relates to automate material handling systems for semiconductor panels and, more particularly, to a growth model automated material handling system.

2. Earlier Related Developments

Historically, there have been two overriding desires amongst consumers that have fueled the advancement of microelectronic devices. These desires have been for minituarization of the devices, and for ever lower prices. Manufacturers have attempted to satisfy these desires, and at least with respect to prices, have reacted by slashing the prices. However, this in turn has had a significant detrimental impact to manufacturer bottom lines. It is clear, that manufacturers that will succeed in the future will be those that can reduce costs across all levels of the manufacturing process involved in producing the microelectronic devices. A significant part of this cost is associated with and locked into the cost of the semiconductor fabrication facility itself and the processing tools and associated support systems installed therein for use in semiconductor fabrication. Referring to FIG. 1, there is shown a perspective view of a representative conventional semiconductor fabrication facility 1. The fabrication or fab facility 1 has a number of fab bays 2 arranged in the facility in a desired array. The fab bays 2 include vacuum and atmospheric processing tools 3, 4 where the semiconductor devices are manufactured. The fab facility 1 also has an automated material handling system installed therein for transporting the semiconductor material to and from the processing tools 3, 4 to effect manufacture of the semiconductor devices. The conventional material handling system in the fab facility shown in FIG. 1, generally includes stockers 5, interbay transport system 6, and intrabay transport system 7. In this arrangement, the stockers 5, used to store the semiconductor devices between various processing evolutions, are located adjacent the opening of the fab bays 2 on a common passage linking the fab bays 2. The interbay transport system 6 is installed in the common passage and connects the stockers 5. This allows semiconductor devices to be transported, by suitable vehicles traveling on the interbay transport system 5 between stockers 5. The intrabay transport system 7, as seen in FIG. 1, has sections 7A–7B disposed in the fab bays linking the stockers 5 adjacent the opening of a given bay to the processing tools 3, 4 in that bay. Thus, semiconductor devices can be transported between the stockers 5 of a bay and the processing tools in that bay with suitable vehicles traveling on the corresponding section 7A–7F of the intrabay transport system.

As can be realized from FIG. 1, the automated material handling system is one of the significant factors in the efficient fabrication process in the fab facility, operating much like the circulation system in a body. With conventional automated material handling systems, the fabrication facility is built and planned around the handling system. The reason at least in part, is that conventional automated material handling systems have a configuration that makes the system itself very inflexible to changes in fabrication requirements or layout changes. Installation of conventional automated material handling systems proceeds in generally one way which results in significant "down" or "idle" time for large portions of the fab facility. FIGS. 2A–2C are schematic plan views illustrating a conventional fab facility I1 (generally similar to fab facility 1 in FIG. 1) at three successive stages during installation of the conventional automated material handling system. As seen in FIG. 2A, in the conventional manner, the work in process storage or stockers I5 and the interbay transport I6 are installed first. Stocker and interbay transport parameters may have to be planned twelve months or more in advance of facility ramp up. The stockers and interbay transport materials are purchased and installed long before tool fit-out. The stockers I5 and the complete interbay transport I6 are installed in anticipation of fabrication layout (in this example there are eight fab bays I8A–I8H shown in phantom), but it is the stockers and interbay transport arrangement itself that defines the fab layout. As can be realized from FIG. 2A, at this stage even though the full complement of stockers I5, and the interbay transport I6 is complete, there is still no automated tool loading or unloading. Any semiconductor production in the fab facility at this stage involves mostly manual tool loading and unloading. FIGS. 2B–2C respectively illustrate the fab facility at successive stages of the automated material handling system installation. In FIG. 2B, some of the intrabay transport sections I7C, I7E–I7F have been installed in the corresponding fab bays I8C, I8C–I8F. At this stage the material handling system is capable of providing only partial automated tool loading. Hence, some manual tool loading/unloading may have to be employed in some areas of the fab facility where processing is desired. Indeed, even in bays where the intrabay transport sections have been installed, fab speed remains significantly limited or constrained from the anticipated fab speed when material handling in the facility is fully automated because of the interface during semiconductor fabrication between bays with manual tool loading/unloading and the automated bays. Intrabay transport sections I7A–I7H have been installed in all desired fab bays I8A–IH of the facility. It is only at this stage that automated tool loading/unloading is available at any desired location of the fab facility. Fabrication "ramp-up" can now occur in the facility. However, the cost due to having large portions of the fab facility substantially idle or at best using manual tool loading/unloading cannot be recovered, and can only be ameliorated by raising the prices of the semiconductor devices produced after fab "ramp-up". The present invention overcomes the problems of the conventional systems as will be described in greater detail below.

SUMMARY OF THE INVENTION

In accordance with a method of the present invention, a method for installing an automated material handling system in a semiconductor fabrication facility is provided. The semiconductor fabrication facility is capable of accommodating a predetermined number of fabrication bays. The handling system has a set of elements including material storage, interbay transport, and intrabay transport elements corresponding to the predetermined number of fabrication bays. The method comprises arranging at least some of the material storage, interbay transport and intrabay transport elements into handling system subsets, and installing one or more of the subsets into the fabrication facility. Each subset has at least one or more corresponding ones of the material storage, intrabay transport and interbay transport elements so that when installed each subset forms a transport circuit allowing substantially unrestricted bi-directional travel of semiconductor device holders between the material storage and at least one of the fabrication bays. The installation of one or more of the subsets into the fabrication facility is accomplished before installation of any element of other of the handling system subsets.

In accordance with another method of the present invention, a method for installing an automated material handling system in a semiconductor fabrication facility is provided. The semiconductor fabrication facility is capable of accommodating a predetermined number of fabrication bays. The handling system has a set of components including storage area, interbay transport, and intrabay transport components corresponding to the predetermined number of fabrication bays. The method comprises relating some of the intrabay transport components to at least some of the interbay transport components and to at least some of the storage area components. The method further comprises forming related intrabay transport components, interbay transport components and storage area components into handling system subsets, and installing one or more of the subsets into the fabrication facility. Each subset has at least one storage area component, at least one interbay transport component and at least one intrabay transport component. Installation of one or more of the subsets into the fabrication facility is accomplished before installation in the fabrication facility of any components of other of the handling system subsets.

In accordance with an embodiment of the present invention, an automated material handling system for a semiconductor fabrication facility is provided. The system comprises a storage area, and a transport section connected to the storage area. The storage area is used for storing semiconductor panel holders. The transport section is connected to the storage area for transporting semiconductor panel holders between the storage area and processing bays of the fabrication facility. The transport section has at least one intrabay transport part and at least one interbay transport part. The transport section is a unified transport section with the at least one interbay transport part and the at least intrabay transport part being joined to each other at a junction so that transport vehicles for transporting the semiconductor panel holders on the transport section are able to cross between the at least one interbay part and the at least one intrabay part. The junction allows addition of either another interbay transport part or another intrabay transport part when the system is available for use.

In accordance with another embodiment of the present invention, an automated material handling system for a semiconductor fabrication facility is provided. The system comprises a storage area, and a transport section connected to the storage area. The storage area is for storing semiconductor panel holders. The transport section is connected to the storage area for transporting semiconductor panel holders between the storage area and processing bays of the fabrication facility. The transport section comprises at least one interbay transport part allowing bi-directional travel thereon of transport vehicles for transporting the semiconductor panel holders. The transport section further comprises at least one intrabay transport part allowing bi-directional travel thereon of the transport vehicles, and a switch joining the at least one interbay transport part and the at least one intrabay transport part to each other and allowing bi-directional travel of the transport vehicles between the at least one interbay and at least on intrabay parts. The switch allows joining of either at least another interbay part or at least another intrabay part to the transport section.

In accordance with still another embodiment of the present invention, an automated material handling system for a semiconductor fabrication facility is provided. The system comprises a first segment, and a second segment. The first segment comprises material storage, a first interbay transport section, and a first intrabay transport section connected to each other for forming a first transport circuit allowing transport of semiconductor panel holders forth and back between the material storage and at least one fabrication bay of the fabrication facility. The second segment comprises other material storage, a second interbay transport section, an a second intrabay transport section connected to each other for forming a second transport circuit independent from the first transport circuit. The first segment is arranged to allow one or more of the other material storage, second interbay transport section and second intrabay transport section of the second segment to be connected to the first segment when the first segment is available for use in the fabrication facility.

BRIEF DESCRIPTION OF THE DRAWINGS

The foregoing aspects and other features of the present invention are explained in the following description, taken in connection with the accompanying drawings, wherein:

FIG. 4 is an enlarged schematic diagram of part of the material handling system in FIG. 3;

DETAILED DESCRIPTION OF THE PREFERRED EMBODIMENT

Figure 3:
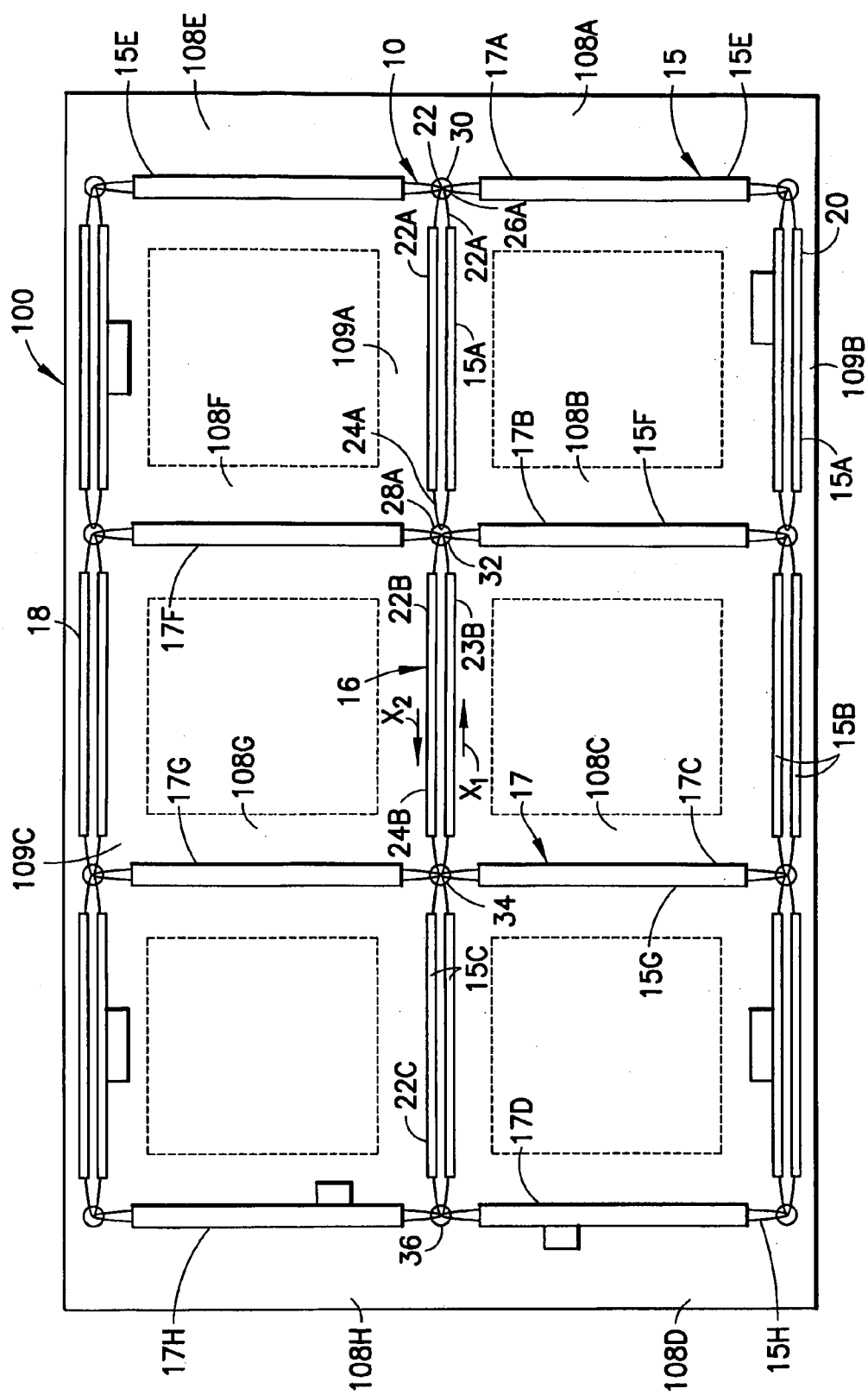
FIG. 3 is a schematic plan diagram of a semiconductor fabrication facility with an automated material handling system incorporating features of the present invention.

Referring to FIG. 3, there is shown a schematic diagram of a semiconductor fabrication facility 100 with an automated material handling system 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

Figure 1:
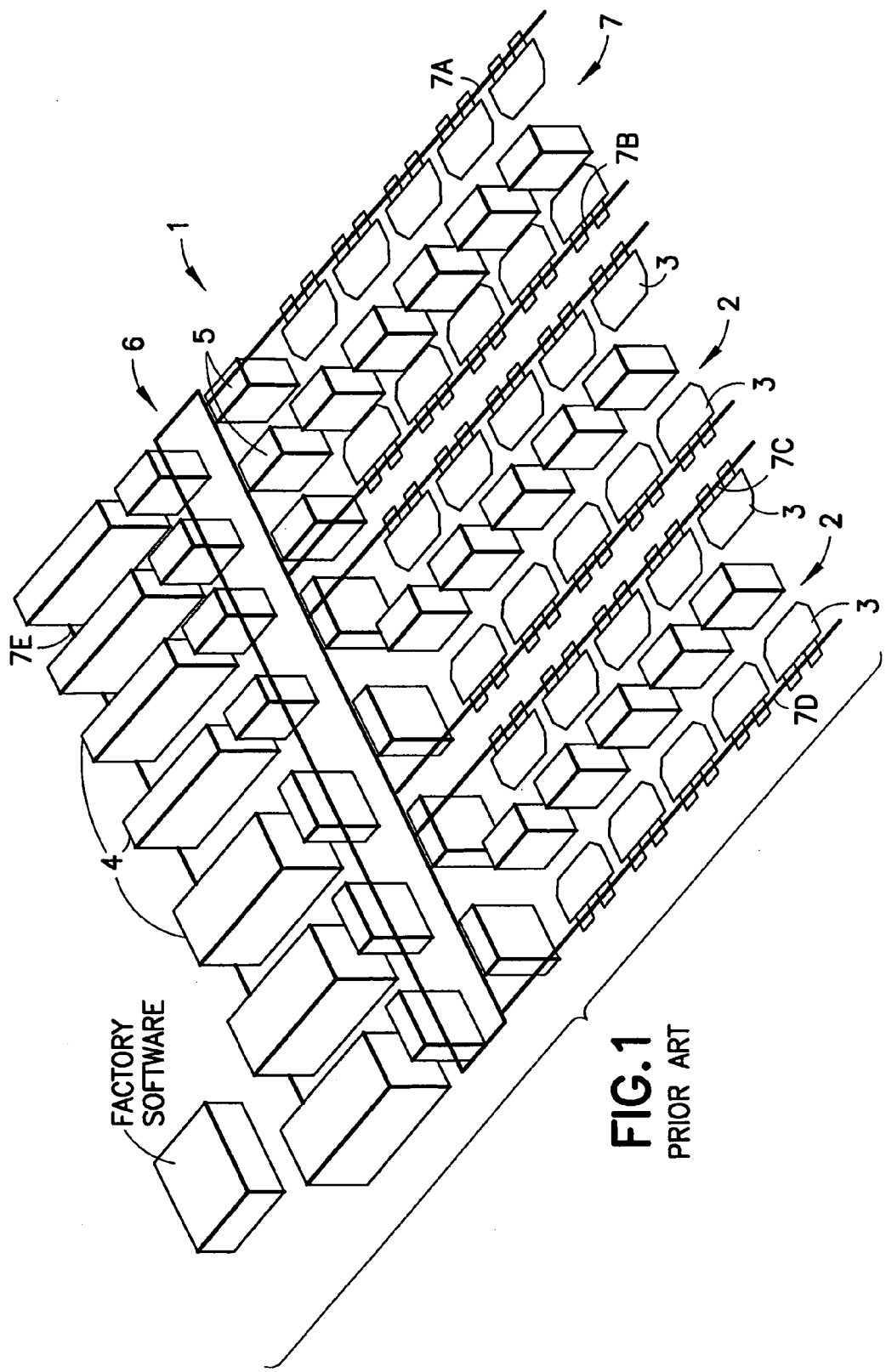
FIG. 1 is a schematic perspective view of a semiconductor fabrication facility with a conventional material handling system.
Figure 2A:
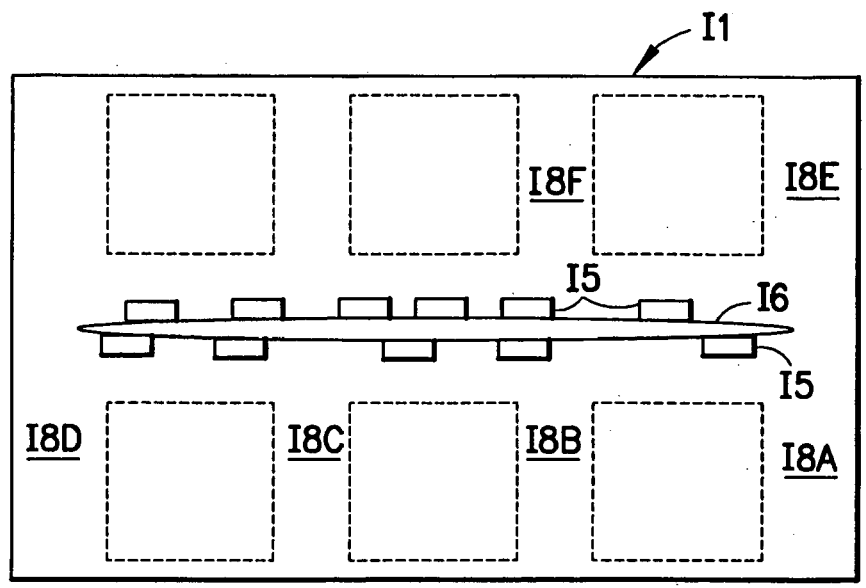
FIGS. 2A–2C are schematic plan diagrams respectively showing another semiconductor fabrication facility with another conventional material handling system at three different stages of installation.
Figure 2B:
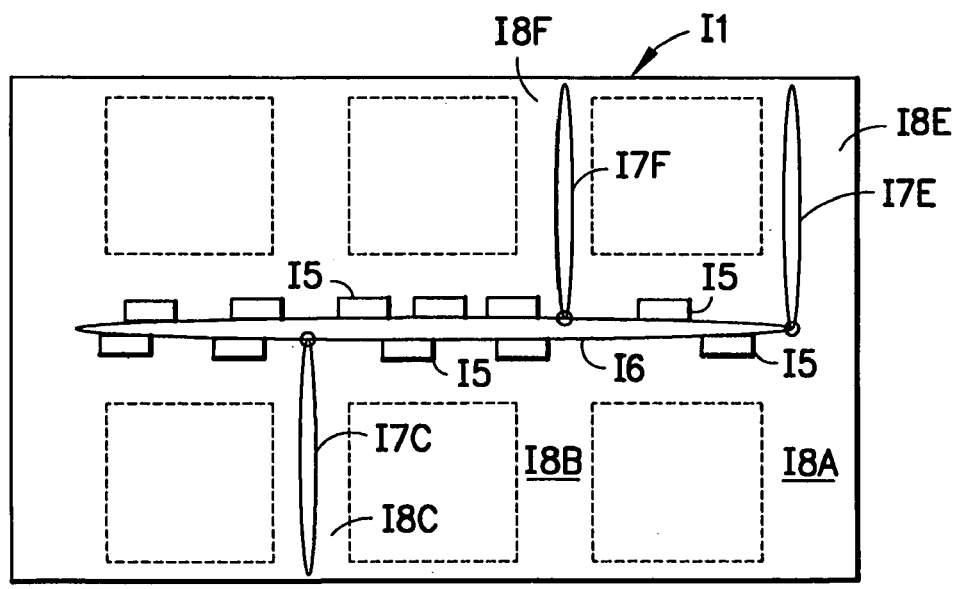
Figure 2C:
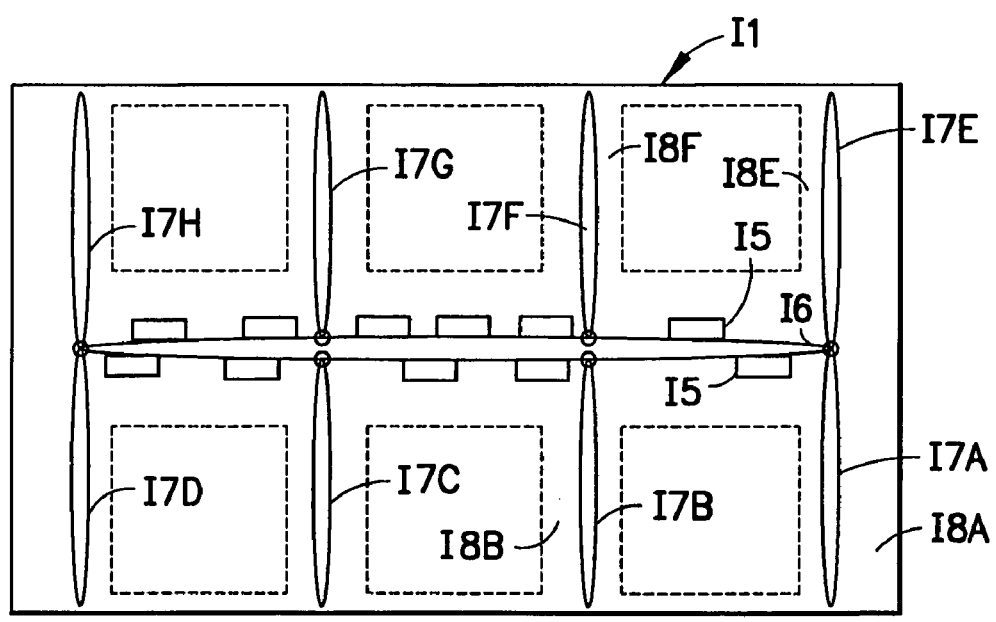

Still referring to FIG. 3, the semiconductor fabrication or fab facility 100 is generally similar to the fabrication facility 1 described before with reference to FIG. 1. The fab facility 100 has a general rectangular planform with semiconductor device processing tools (similar to atmospheric and vacuum tools 3, 4 shown in FIG. 1) arranged in fab bays, the edge boundaries of which are shown in phantom in FIG. 3. In this embodiment, the fab bays are arranged in a general grid pattern forming connecting passages or lanes 109A–109C between the fab bays. In alternate embodiments, the fab facility may have any desired shape, and the fab bays may be arranged therein in any desired pattern. The fab facility 100 is shown in FIG. 3 as having eight fab bays 108A–108H for example purposes only. In alternate embodiments there may be any desired number of fab bays in the facility. Furthermore, although the present invention will be described below with specific reference to an automated material handling system for a semiconductor fab facility, the present invention is equally applicable to any suitable automated material handling system used in any suitable fabrication facility.

The material handling system 10 generally comprises material storage 15, interbay transport system 16, and intra bay transport system 17. The material storage 15 is used for storing canisters or containers, such as front opening universal pod (FOUP) canisters, holding work in process semiconductor devices. The semiconductor devices may be semiconductor wafers such as 200 mm or 300 mm wafers or any other suitable semiconductor device capable of being fabricated in an automated semiconductor automated facility. The interbay transport system 16 is located in a passage or lane linking the fab bays 108A–108H of the facility. The interbay transport system is connected to the material storage and links the material storage to the fab bays. The interbay transport provides a transport path for transport vehicles (not shown) to travel between the material storage and fab bays, so that canisters (not shown) can be transported from material storage to the various fab bays. The intrabay transport system 17 is generally located in the fab bays of the facility 10. The intrabay transport system 17 is connected to the interbay transport system 16 to allow transport vehicles holding storage canisters to travel from the interbay transport 16 to the various processing tools (not shown) in the fab bays and return to the interbay transport and material storage 15. The material storage 15, the interbay transport 16, and intrabay transport 17 are connected to form a unified material handling system as will be described in greater detail below. The material storage 15, interbay transport 16 and intrabay transport system 17 are each made up of discrete sections or elements capable of being connected to each other or to other sections of the same systems in a modular manner. As will be described further below, corresponding or related elements of the material storage, interbay transport, and intrabay transport systems may be arranged into subsets for separate installation into the fab facility. Each subset may have at least a material storage section, an interbay transport section and an intrabay transport section which when installed and connected to each other allow the subset to form a complete transport circuit between the material storage element of the given subset and processing tools in a fab bay. Accordingly, each subset once installed may become operational immediately after installation. The subsets form a building block for the installation of the automated material handling system 10. Additional material handling system subsets, as well as individual elements/sections may be successively added until the automated material handling system installation is completed.

In greater detail now, and with reference still to FIG. 3, the interbay transport system 16 in this embodiment includes three interbay transport branches, a central branch 22, and two peripheral branches 18, 20. In alternate embodiments, the interbay transport system may have any suitable number of branches or runs. The interbay transport branches 18, 20, 22 of the embodiment shown in FIG. 3 are substantially parallel to each other, though in alternate embodiments different interbay branches may not be parallel. Indeed, interbay transport branches may not connect all fab bays and may have any shape. The present invention encompasses any interbay transport system arranged in any desired manner to connect any desired number of fab bays. In this embodiment, the interbay transport branches 18, 20, 22 are generally similar to each other, and will be described below with specific reference to the central branch 22. As noted before, the interbay transport branch 22 is made up of interbay transport segments or elements 22A–22C. In the embodiment shown in FIG. 3, there are three segments 22A–22C for example purposes only, and in alternate embodiments the interbay transport branch may have any desired number of segments. As seen in FIG. 3, when linked together the segments 22A–22C allow the interbay transport branch to span all fab bays 108A–108D, and 108E–108H on both sides of the facility. In this embodiment, each interbay transport segment 22A–22C is shown as being generally similar. Each segment 22A–22C is of sufficient length to span between two adjoining fab bays. For example, segment 22A spans between adjoining fab bays 108A–108B. In this case, because segment 22A is located in the central interbay transport branch, the segment 22A also spans between opposite bays 108E–108F. In alternate embodiments, the span of each segment may be different. As will be described further below each interbay transport segment 22A–22C can be installed and operated independently from the other segments in the transport branch.

As seen in FIG. 3, each segment 22A–22C may have multiple transport paths 23A–24A, 23B-24-B, 23C–24C provided by any suitable table means (as will be described below) for transport vehicles (not shown), allowing the vehicles to traverse the segment. The transport paths of each segment are arranged to allow substantially simultaneous bi-directional travel of the transport vehicles on the segment (in directions indicated by arrows X1,X2). Referring also to FIG. 4 (that shows an enlarged schematic diagram of part of the automated material handling system handling system 10), in this embodiment each segment 22A–22C may have two transport paths 23A–24A, 23B–24B, 23C–24C, extending between the ends of the segment. One path, such as for example 23A, 23B, 23C, may be used by transport vehicles to travel in one direction (indicated by arrow $X_1$) and the other path, 24A–24C, may be used for travel in the opposite direction (indicated by arrow $X_2$). The travel paths may be dedicated to a given direction of travel or the direction of travel may be switched as desired according to a transport algorithm to suit transport loading conditions. For example, in the non-dedicated case transport path 23A of segment 22A may at first be used for vehicles traveling in the direction indicated by arrow $X_1$ in FIG. 3. At that time, path 24A provides for travel in direction $X_2$. However, if at some later time it is anticipated that some number of transport vehicles are situated in the facility and are going to a location where it would be more efficient to move over path 23A in direction $X_2$, then the travel direction for path 23A may be changed to direction $X_2$, path 24A now becoming used for $X_1$ travel. It is noted, that in this embodiment travel direction need not be the same for similar paths 23A–23C, 24A–24C of each segment. For example, transport path 23A may be used for travel direction $X_2$, but transport paths 23B, 23C may be used for the opposite travel direction $X_1$. This ability is provided by the interbay transport segments 22A–22C in this embodiment because as seen in FIGS. 3 and 4, the corresponding transport paths of each segment converge towards each other at opposite ends 26A–26C and 28A–28C of each segment 22A–22C. As seen in FIG. 3, each segment 22A–22C has a junction 30, 32, 34, 36 at corresponding opposite ends of the segment. For example, in the embodiment shown in FIG. 3 segment 22A has a junction 30 at one end 26A and another junction 32 at the opposite end 28A. Segments 22B, 22C are similar with respective junctions 32, 34, 36 at corresponding opposite ends 26B–26C, and 28B–28C of the segments. The respective travel paths 23A–23C, 24A–24C of each segment 22A–22C substantially intersect at each corresponding junction 30, 32, 34, 36. As seen in FIG. 3, the junctions 32, 34 between segments are used to connected the adjoining segments to each other. Junction 32 connects adjoining ends 28A–26B of segments 22A, 22B and junction 34 connects adjoining ends 28B–26C of segments 22B, 22C. Junctions 32, 34 are common to the corresponding adjoining segments 22A–22B, and 22B–22C. Junctions 32, 34 may further allow ties between same or different transport paths of the connected segments. For example, junction 32 may be used to tie transport path 24A of segment 22A to the transport path 23B of segment 22B thereby allowing transport vehicles to cross between paths 23B and 24A of the adjoining segments. As seen in FIG. 4, in another embodiment two junctions 32A, 34B may be used between adjoining segments 22A, 22B with an intermediate portion in between. One junction 32A is located at one end 28A of a segment, and the other junction 32B at the adjoining end 26B. In this case, each junction 32A, 32B provides a common tie for all corresponding travel paths of the respective segments to which the junction is connected. The two junctions 32A, 32B may be oriented in alignment with the general direction of the interbay transport branch 22. Hence, to travel between transport paths of adjoining segments, a transport vehicle must traverse both junctions 32A, 32B between the interbay transport segment.

Figure 6:
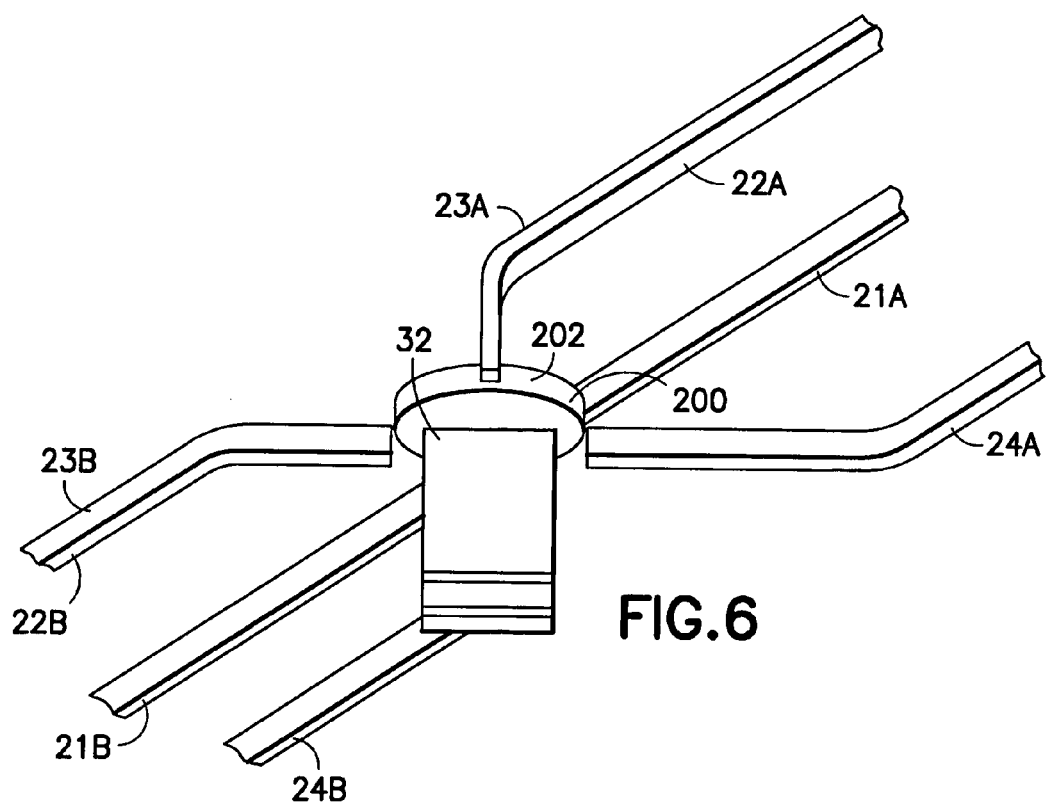
FIG. 6 is a partial perspective view of a junction between interbay transport and intrabay transport segments of the material handling system in FIG. 3.

The interbay transport system 16 is shown in FIGS. 3 and 4 and has been described above in the context of a representative configuration which can be provided by any number of suitable types of material handling systems. FIG. 6 is a partial perspective view of the interbay transport branch 22 showing one suitable example of the types of handling system materials that may be used for the automated material handling system 10. As seen in FIG. 6, the interbay transport segments 22A–22C (only parts of segments 22A, 22B are shown in FIG. 6 for example purposes) are formed using an overhead rail system such as the Aeroloader™ system available from Brooks-PRI Automation, Inc. In this case, each transport path 23A–23C, 24A–24C is provided by a corresponding rail or track. The tracks are mounted to the fab facility overhead. Automated overhead transport vehicles 200 (only one is shown in FIG. 6 for example) are mounted on one of the tracks. The transport vehicle 200 may be self propelled to autonomously travel on the corresponding rail forming each of the travel paths. Each vehicle travels on the desired transport paths according to a transport algorithm which may be preprogrammed into vehicle memory (not shown) or loaded from a central processor (not shown) operating the automated material handling system. FIG. 6 shows a third track 21A, 21B for each segment (not shown in FIGS. 3 and 4 for clarity) which provides a high speed or "fly-through" transport path for each segment. As described before, the tracks converge at the junction 32 between the adjoining segments. In the embodiment shown in FIG. 6 junction 32 includes a turntable 202, though any suitable track switching device may be used. In this case the turntable has three positions to tie the diametrically opposed track ends of the respective transport paths 21A–21B, 23A–23B, 24A–24B. When the turntable is positioned in one of these positions, a transport vehicle 200 may cross between diametrically opposed track ends without moving the turntable. Otherwise, the transport vehicle may be positioned onto the turntable, and the turntable may be rotated as desired to allow the transport vehicle to move from any track 21A, 23A, 24A of one segment to any other track 21B, 23B, 24B of the connected segment. The movement of the turntable may be automated, controlled by a suitable program from the central processor of the system.

Referring again to FIG. 3, as noted before, the intrabay transport system 17 is also made up of sections 17A–17H. In the embodiment shown, there are eight intrabay transport sections, though in alternate embodiments the intrabay transport may have any suitable number of sections. Each section may comprise a single transport segment or element, or may comprise a number of interlinked segments as will be described further below. Each segment 17A–17H may extend within a single fab bay or may be branched to other fab bays. Referring to FIG. 4, the schematic diagram shows the intrabay transport segments 17A–17D respectively in four of the facility fab bays. The intrabay transport segments 17A–17D, and 17E–17H are generally similar to each other and hence are schematically illustrated the same in FIG. 3. FIG. 4, however for example purposes, shows the segments 17A–17D with each having one of the many suitable configurations. Each of the segments 17A–17D has multiple transport paths 50A–50D, 52A–52D, allowing substantially simultaneous by-directional travel of transport vehicles along each segment in a manner substantially similar to that described before for the interbay transport segments. The transport paths of the intrabay segments 17A–17H may be provided by overhead tracks similar to the tracks illustrated in FIG. 6 for the interbay transport. Transport vehicles 200 may thus travel on the intrabay transport system 17. Intrabay segment 17D has two transport paths 50D, 52D each of which may be used for travel in either direction (indicated by arrows Y3 in FIG. 4). Together, however, the two transport paths allow for simultaneous bi-directional travel with one vehicle traveling in one direction on one path 50D and another vehicle traveling in the opposite direction on the second transport path 52D. The transport paths 50D, 52D converge towards each other at opposite ends 54D, 56D of the segment. In this case, paths 50D, 52D are merged into each other at the far end 56D. At the near end 54D the transport paths 50D, 52D terminate in junction 36. As noted before, junction 36 is the terminus of interbay transport paths 23C, 24C of an interbay transport segment 22C. Thus, the interbay transport paths 23C, 24C are unified with the intrabay transport paths 50D, 52D of the intrabay transport segment 17D. The junction 36, provided for example by a turntable similar to turntable 202 in FIG. 6, allows the transport vehicle to cross between any of the interbay transport paths 23C, 24C and any of the intrabay transport paths 50D, 52D joined by junction 36. As seen in FIG. 4, the track for each transport path 50D, 52D may be disposed over the fab tools 103. Accordingly, the transport vehicles travelling on paths 50D, 52D may be stopped directly over the desired tool 103. The transport vehicle may be equipped with a suitable hoist allowing the vehicle to lower/raise a holding canister to/from the tool interface.

Figure 5:
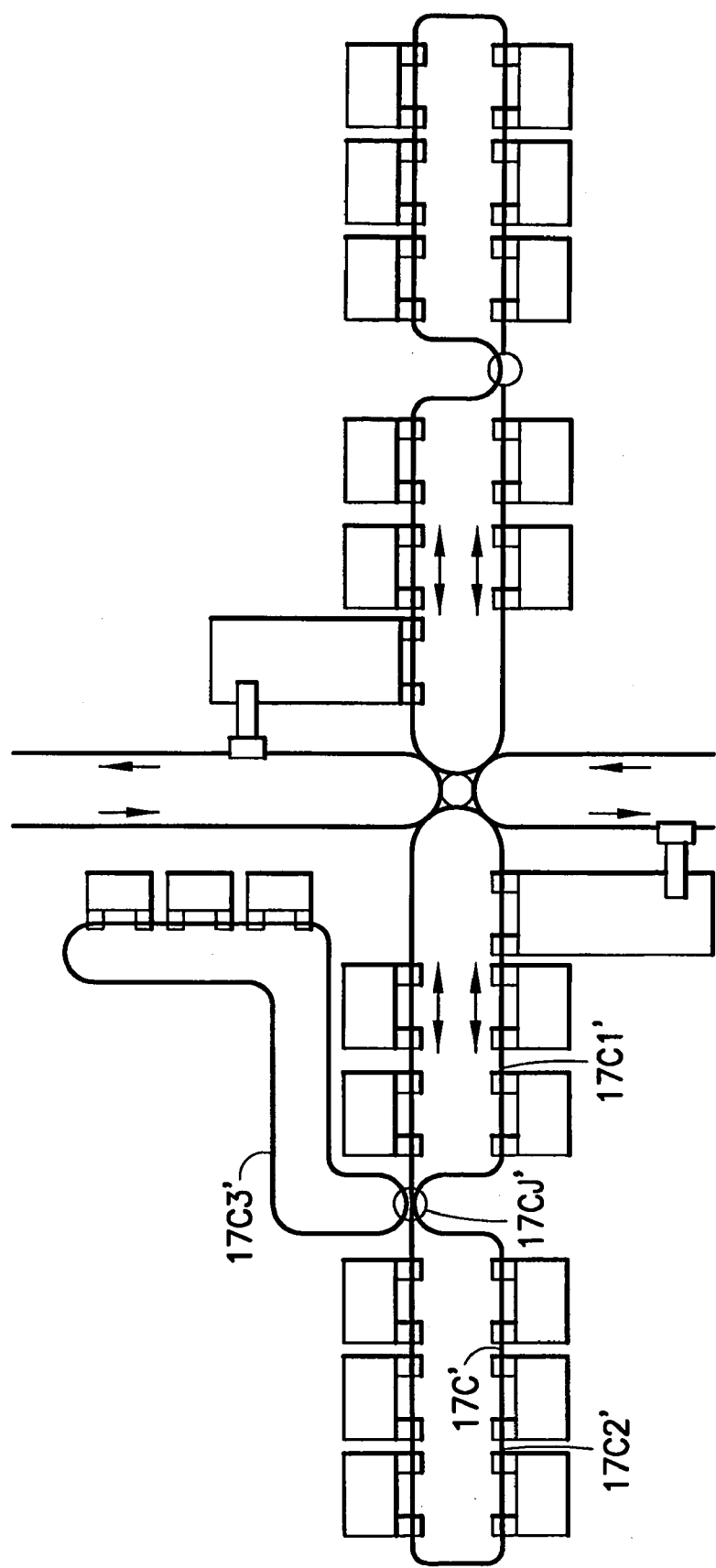
FIG. 5 is another enlarged schematic diagram of another part of the material handling system in FIG. 3.

Still referring to FIG. 4, the other intrabay transport sections 17C–17A are similar to section 17D except as noted below. Intrabay section 17C may comprise two segments 17C1, 17C2. The segments 17C1, 17C2, are joined by an intermediate junction 17AJ. Both segments have two transport paths 50C, 52C, and the transport paths of the two segments are connected to each other by junction 17CJ in a manner similar to that described before. Intermediate junction similar to junction 17CJ may be used to connect a branch intrabay segment to the principal segment. An example of an arrangement of this kind is illustrated in FIG. 5. In this embodiment, there is a principal intrabay segment $17C^1$, similar to segment 17C in FIG. 4. A branch intrabay segment $17C3^1$ is joined at junction $17CJ^1$ to the principal segment $17C^1$. Thus, junction $17CJ^1$ joins the travel paths of segments $17C1^1$. $17C^2$, $17C3^1$ to each other. An intrabay transport section may have any desired number of intermediate junctions similar to junction 17CJ. Further, by providing an intrabay transport section with one or more intermediate junctions, transport vehicles may be switched between travel paths of the intrabay section at different locations which increases the operational flexibility of the material handling system.

As seen in FIG. 4, section 17B illustrates another example of a suitable configuration for intrabay transport sections of the material handling system. In this case, the section has four travel paths 50B, 51B, 52B, 53B. The paths are parallel to each other. Outer paths 50B, 52B are located over the tool interface. The inner paths 51B, 53B may be used for high speed transport, such as returning holding canisters after semiconductor device processing. In FIG. 4, inner paths 51B, 53B are shown as being used for travel in the return direction (indicated by arrow Y2) and the outer paths 50B, 52B for travel in the outward direction (indicated by arrows Y1) for example purposes. In alternate embodiments, the paths may be used for travel in any suitable direction. The transport paths 50B, 51B, 52B, 53B are merged at junction 60 at one end of the section. At the opposite end two adjoining paths 50B, 51B are merged into junction 32A, and the other two paths 52B, 53B are merged into junction 32B. As seen in FIG. 4, junction 32A joins the interbay transport paths 23A, 24A to intrabay paths 50B, 51B. Junction 32B joins the interbay transport paths 23B, 24B to intrabay paths 52B, 53B. Hence, transport vehicles may cross directly between the intrabay transport paths 23A–23B, 24A–24B, of interbay segments 22A, 22B and any of the intrabay transport paths 50B, 51B, 52B, 53B of intrabay section 17B. Interbay transport section 17A is similar to section 17B, but is provided with intermediate junctions 17AI, 17AJ as shown. Each intermediate junction 17AI, 17AJ joins a corresponding pair of transport paths 52A–53A and 50A–51A. Furthermore, a lateral shunt 17AS joins the junction to each other.

Figure 9A:
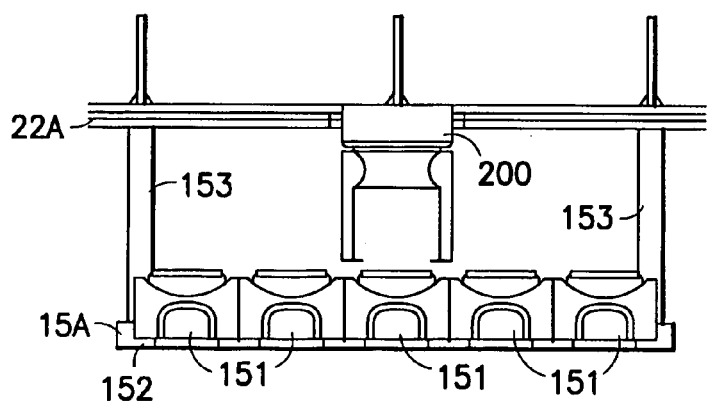
FIGS. 9A–9B are partial elevation views of representative portion of the material storage in FIGS. 7–8.
Figure 9B:
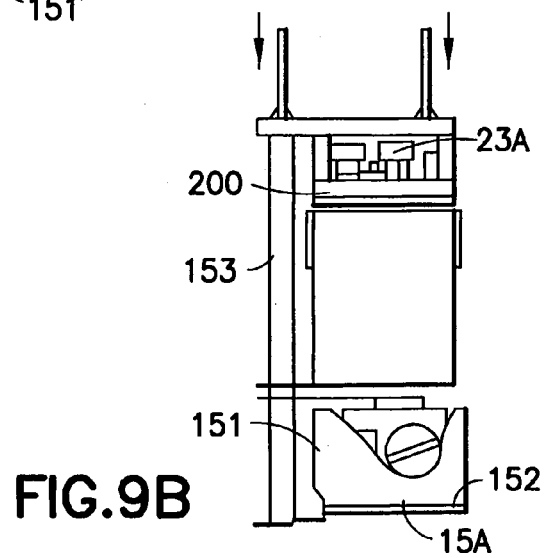

Referring now again to FIG. 3, the material storage 15 for the automated material handling system 10 is a uniformly distributed storage system extending along sections of the interbay 16 and intrabay 17 transport systems. The material storage 15 is provided by longitudinally distributed storage sections 15A–15C, 15E–15H shown schematically in FIG. 3. The storage sections 15A–15H are substantially similar, and in the embodiment shown in FIG. 3, storage sections 15A–15H are positioned along each of the interbay 16 and intrabay 17 transport sections. FIGS. 9A–9B respectively show partial side elevation views of a representative distributed storage section 15A. The storage section 15A in the embodiment has an elongated support tray 152 sized to accept FOUP canisters arranged in a row. In alternate embodiments, the support tray may be sized for storing any suitable holding canister. The tray 152 may be provided with any suitable length allowing the storage section to be sized as desired. Also, the tray may be sized to accept multiple side-by-side rows of holding canisters. As seen in FIGS. 9A–9B, the support tray 152 may be suspended from the facility overhead with support structure 153. This provides an under track storage system which in effect takes up no floor space. In this embodiment, the support tray 152 may be segmented or compartmentalized to form substantially similar compartments 151 along the section 15A. Each compartment is capable of storing a single FOUP canister. The compartments 151 are generally suspended under the tracks forming the transport paths, such as for example, transport path 23A of segment 22A (see FIGS. 3 and 9A–9B), of the intrabay 17 and interbay 16 transport sections. This allows the transport vehicle 200 to hoist FOUP canisters directly to and from the storage section 15A suspended under the track. The compartments 151 may be modularized which allows the capacity of the storage sections to be readily changed by merely adding or removing storage compartment modules 151 from the storage section.

Figure 7:
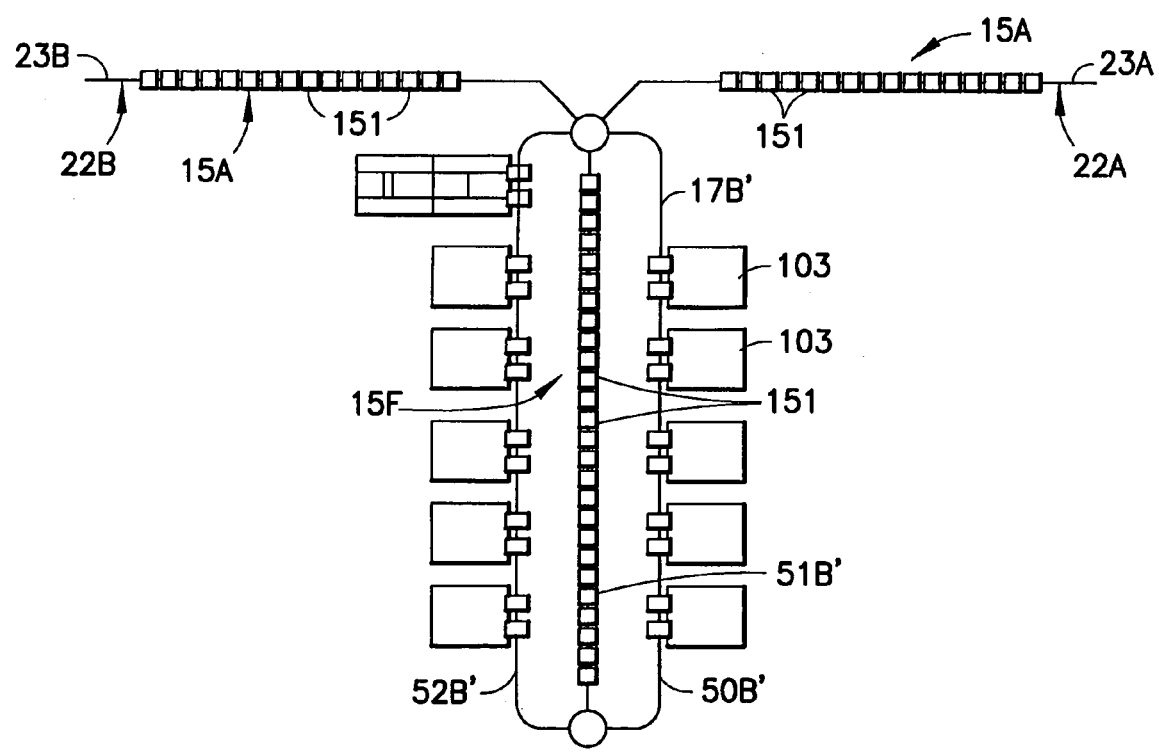
FIG. 7 is a schematic plan view of material storage of the material handling system in FIG. 3 in accordance with a first embodiment.
Figure 8:
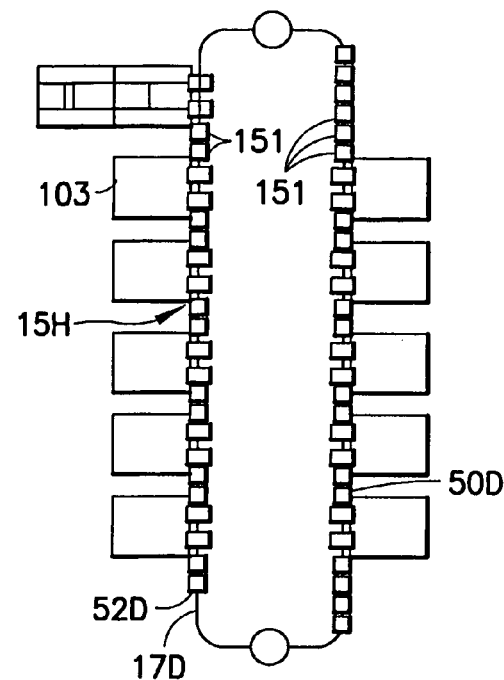
FIG. 8 is another schematic plan view of material storage of the material handling system in accordance with another embodiment.

FIG. 8 shows a representative material storage section 15H in accordance with one embodiment. The storage section 15H is mounted to be suspended under a representative intrabay transport segment 17D (see also FIG. 4). In this embodiment, the storage section 15H has material storage compartments located under each transport path 50D, 52D of the segment. FIG. 8 illustrates an example of a possible arrangement of the storage compartments of a storage section on an intrabay transport segment, and any other suitable arrangement may be used in alternate embodiments. FIG. 7 shows other representative storage section 15F and portions of storage sections 15A located respectively under another intrabay transport segment $17B^1$ and portions of interbay segments 22A, 22B. Intrabay segment $17B^1$ is generally similar to segment 17B shown in FIG. 4, except in FIG. 7 the segment $17B^1$ has only one inner transport path $51B^1$. In this case, the storage section 15F has storage compartments 151 located under the inner track $51B^1$. The storage section, if desired, may also have storage compartments (not shown) located along one or both of the outer tracks $50B^1$, $52B^1$ in a manner similar to that shown in FIG. 8. This illustrates the flexibility of the material storage system 15 allowing the available storage to be increased/decreased as desired in any desired location of the fab facility. As seen in FIG. 7, material storage sections 15A under interbay segments 22A–22B are similar to the storage sections located under intrabay segments $17B^1$ with storage compartments located in any desired number under the interbay transport paths (only transport paths 23A, 23B are shown in FIG. 7 for example purposes).

Figure 3A:
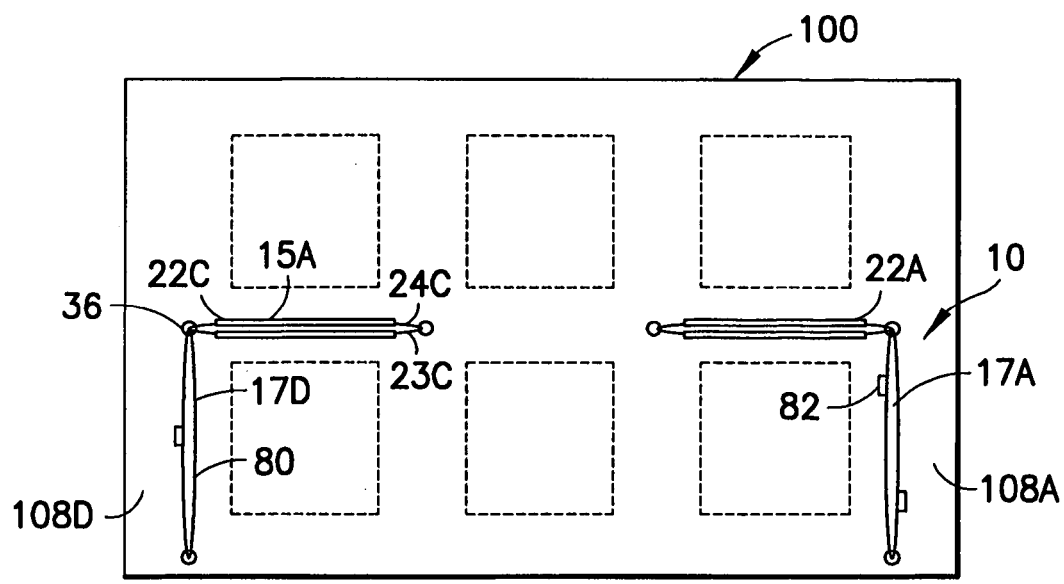
FIGS. 3A–3D are other schematic diagrams of the material handling system in FIG. 3 respectively showing the system in different stages of installation in the fabrication facility.

The method for installing material handling system 10 into facility 100 will be described with reference to FIGS. 3A–3D which respectively illustrate the material handling system 10 at different successive stages of installation. As noted before, as can be seen in FIGS. 3A–3D, unlike conventional systems, installation of material handling system 10 proceeds in a "building block" like manner. Each building block is a subset of segments or elements from each of the material storage system 15, the interbay transport system 16, and the intrabay transport system 17. FIG. 3A shows the material handling system near the beginning of the installation process. In this case, two subsets 80, 82 have been installed. Subset 80 comprises interbay segment 22C, and intrabay segment 17D joined together at junction 36. Subset 80 also includes material storage section 15A located under the tracks 23C, 24C of the interbay segment, though in alternate embodiments the material storage sections may be located under the tracks of either the interbay and/or intrabay segments as desired. Subset 82 is similar to subset 80 but comprising interbay segment 22A, joined to intrabay segment 17A and material storage section 15A. As can be realized from FIG. 3A, each subset 80, 82 forms a complete transport circuit. This allows transport vehicles to move freely around the transport circuits enabling automated tool loading/unloading in fab bays 108D, 108 serviced by the subset 80, 82. The interbay 22A, 22C, intrabay 17A, 17C and material storage 15A sections and segments arranged and installed as subsets 80, 82 were selected in order to enable automated operations in fab bays 108A, 108D. In alternate embodiments, the subsets of the material handling system installed first may comprise any desired combination of interbay segments, intrabay segments, and material storage sections capable of being joined and installed as a subset to enable automated operation of any desired fab bay of the facility. It is noted, that the cost associated with procurement and installation of subsets 80, 82 are significantly smaller than procurement and installation of the whole material handling system. However, even at this early stage of installation of the material handling system 10, it is possible to have automated operation of one or more of the fab bays. This is in sharp contrast with conventional system where automated operation was accomplished after purchase and installation of the whole material storage system and interbay transport system.

Figure 3B:
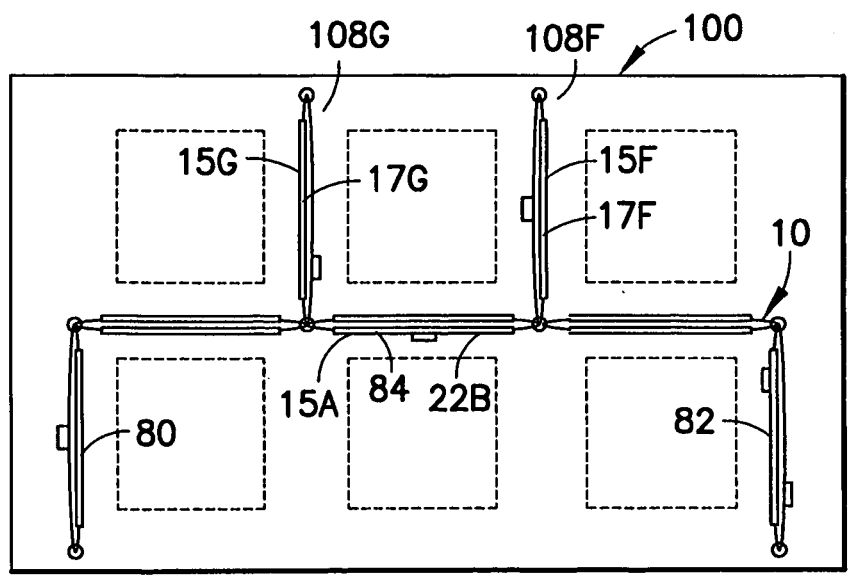
Figure 3C:
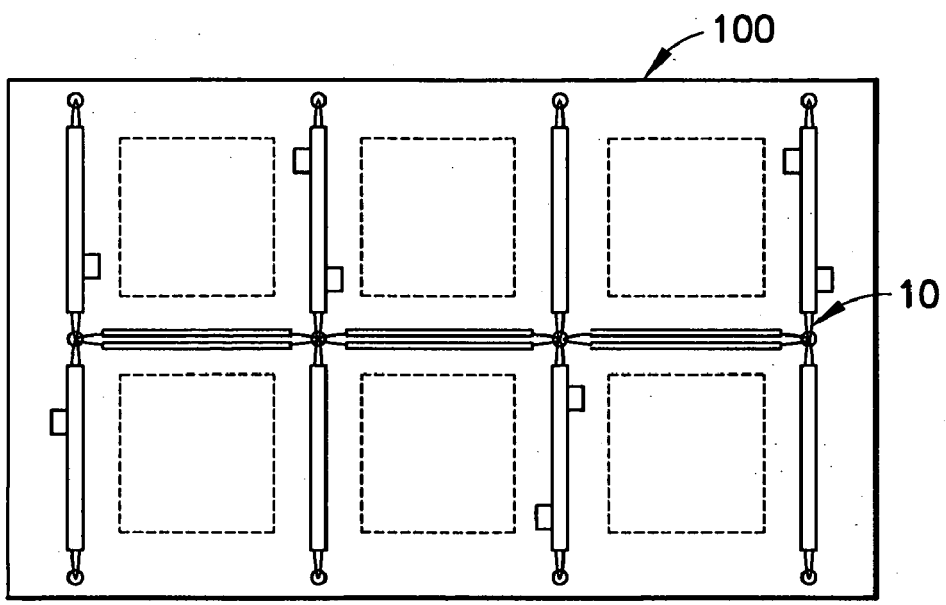
Figure 3D:
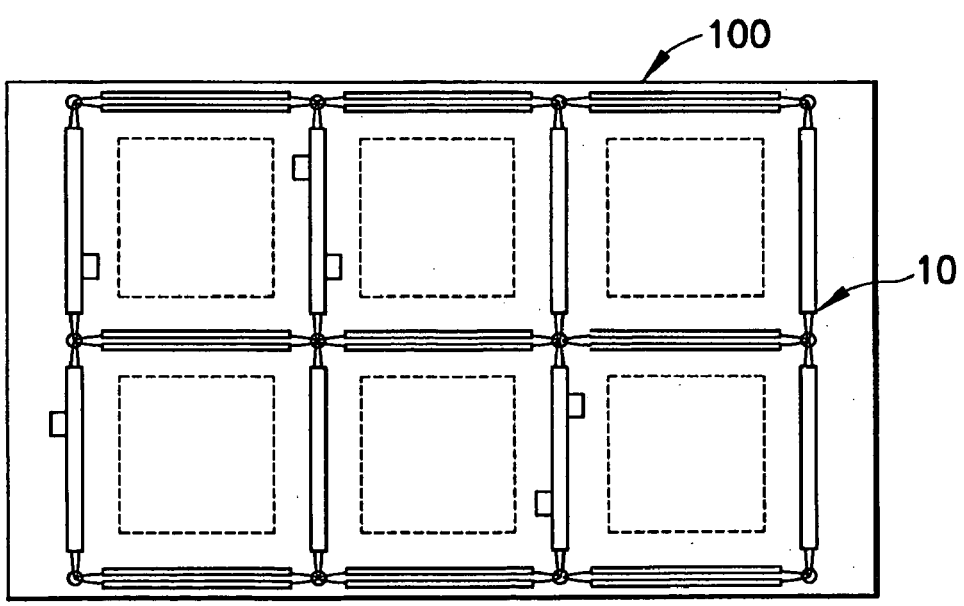

FIG. 3B shows the material handling system 10 with another subset 84 installed. Subset 84 includes interbay segment 22B, intrabay segments 17F, 17G and related material storage sections 15A, 15F, 15G. It is noted, that subset 84 may be installed and brought into operation as a unit or may have been installed in parts. For example, segment 22B may have been installed for tying subsets 80, 82 together. Otherwise, intrabay segments 17G, 17F may respectively have been installed and joined to subsets 80, 82. In alternate embodiments, any other subsets, or segments of the material handling system may have been installed as desired. FIGS. 3C and 3D respectively show further stages of material handling system 10 installation until completion. The material handling system 10 installation is shown complete in FIG. 3D, with the system 10 being substantially the same as shown in FIG. 3 and described above. The material handling system 10 provides a "grow as you go" capability. The system 10 is highly flexible and can be expanded or altered as additional capacity is needed or the plan layout changed. This minimizes idle time of fab bays in the fab facility with respect to outlays for purchase and installation of the material handling system.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for installing an automated material handling system in a semiconductor fabrication facility capable of accommodating a predetermined number of fabrication bays, the handling system having a set of elements including material storage, interbay transport, and intrabay transport elements corresponding to the predetermined number of fabrication bays, the method comprising:

arranging at least some of the material storage, interbay transport and intrabay transport elements into handling system subsets, each subset having at least one or more corresponding ones of the material storage, interbay transport and intrabay transport elements so that when installed each subset forms a transport circuit allowing substantially unrestricted bi-directional travel of semiconductor device holders between the material storage and at least one of the fabrication bays; and installing one or more of the subsets into the fabrication facility before installation of any element of other of the handling system subsets.

2. The method according to claim 1, further comprising selecting at least another of the fabrication bays not reached by the one or more installed subsets, and installing at least another of the subsets to transport semiconductor device holders between the material storage elements and the at least another of the fabrication bays.

3. The method according to claim 2, wherein installation of the at least another of the subsets is performed without interrupting operation of the one or more installed subsets.

4. The method according to claim 2, further comprising repeating the steps of selecting at least another of the fabrication bays not reached by the one or more installed subsets and installing at least another of the subsets until the installed subsets of the handling system allow semiconductor device holders to be transported between the material storage elements and each of the predetermined number of fabrication bays.

5. The method according to claim 1, wherein the material storage elements are adapted for storing semiconductor device holders, and wherein the holders are capable of holding at least one of 200 mm or 300 mm semiconductor wafers.

6. The method according to claim 1, wherein installing comprises joining the corresponding ones of the interbay transport and intrabay transport elements of at least one of the subsets to each other so that transport vehicles of the handling system are able to cross between the corresponding ones of the interbay transport and intrabay transport elements of the at least one of the subsets.

7. The method according to claim 1, wherein installing comprises connecting the corresponding ones of the interbay transport and intrabay transport elements of at least one of the subsets to each other so that the transport circuit formed by the at least one of the subsets is a unified transport circuit.

8. The method according to claim 1, wherein installation of at least one of the subsets forms an independent transport circuit from another transport circuit formed by another of the installed subsets.

9. The method according to claim 1, wherein installing comprises locating the corresponding ones of the interbay transport and intrabay transport elements to form overhead transport paths in the fabrication facility.

10. The method according to claim 1, wherein installing comprises, in at least one of the subsets, mounting the material storage elements to be suspended under at least one of the corresponding ones of the interbay transport or the intrabay transport elements.

11. The method according to claim 1, wherein installing comprises, in at least one of the subsets, distributing the material storage element substantially uniform along a portion of at least one of the corresponding ones of the interbay transport or the intrabay transport elements.

12. A method for installing an automated material handling system in a semiconductor fabrication facility capable of accommodating a predetermined number of fabrication bays, the handling system having a set of components including semiconductor transport container storage area, interbay transport, and intrabay transport components corresponding to the predetermined number of fabrication bays, the method comprising:

relating some of the intrabay transport components to at least some of the interbay transport components and to at least some of the storage area components;

forming the related intrabay transport components, interbay transport components and storage area components into handling system subsets, each subset having at least one storage area component, at least one interbay transport component and at least one intrabay transport component; and installing one or more of the subsets into the fabrication facility before installation in the fabrication facility of any component of other of the handling system subsets.

13. The method according to claim 12, wherein installing comprises disposing each subset to form a transport circuit allowing material to be transported between the at least one storage area component of the subset and a corresponding one of the number fabrication bays.

14. The method according to claim 12, wherein each subset is capable of forming an independent transport circuit from another subset.

15. The method according to claim 12, wherein installing comprises, in at least one of the subsets, connecting the at least one interbay transport component to the related at least one intrabay transport component so that the at least one subset forms a unified transport circuit allowing transport vehicles to cross between the at least one interbay transport component and the at least one intrabay transport component.

16. The method according to claim 12, wherein installing comprises, in at least one of the subsets, mounting the at least one storage area component to be suspended under the at least one interbay transport or intrabay transport components.

17. The method according to claim 12, wherein installing comprises, in at least one of the subsets, distributing the at least one storage area component substantially uniform along a portion of the at least one interbay transport or intrabay transport components.

18. The method according to claim 12, wherein installing comprises mounting at least one of the at least one interbay transport or intrabay components to form an overhead transport path.

19. The method according to claim 12, wherein installing comprises joining the at least one interbay and intrabay components of at least one of the subsets to each other with a switch for switching transport vehicles between the at least one interbay and intrabay components.

20. The method according to claim 19, further comprising selecting at least another of the fabrication bays not reached by the one or more installed subsets, and installing at least another of the subsets to transport material between the storage area components and the at least another of the fabrication bays, wherein the switch is used to connect either the at least one interbay transport component or the at least one intrabay transport component of the at least another of the subsets to one of the installed subsets.

21. An automated material handling system for a semiconductor fabrication facility, the system comprising:
a storage area for storing semiconductor device holders; and
a transport section connected to the storage area for transporting the semiconductor device holders between the storage area and processing bays of the fabrication facility, the transport section having at least one interbay transport part and at least one intrabay transport part;

wherein the transport section is a unified transport section with the at least one interbay transport part and the at least one intrabay transport part being joined to each other at a junction so that transport vehicles for transporting the semiconductor device holders on the transport section are able to cross between the at least one interbay part and the at least one intrabay part, and wherein the junction allows addition thereto of either another interbay transport part or another intrabay transport part when the system is available for use.

22. The system according to claim 21, wherein the storage area comprises storage compartments, at least a nuniber of the storage compartments being uniformly distributed along at least one of the at least one interbay part or the at least one intrabay part.

23. The system according to claim 21, wherein the at least one interbay part has a junction at opposite ends of the at least one interbay part for joining the at least one interbay part to the at least one intrabay part or another intrabay part.

24. The system according to claim 21, wherein the at least one intrabay part has a junction at opposite ends of the at least one intrabay part for joining the at least one intrabay part to the at least one interbay part or another interbay part.

25. The system according to claim 21, wherein the at least one interbay part is capable of allowing simultaneous bi-directional travel of transport vehicles thereon, and the at least one intrabay part is capable of allowing simultaneous bi-directional travel of transport vehicles thereon.

26. The system according to claim 21, wherein the at least one interbay transport part has multiple overhead tracks extending between the opposite ends of at least one interbay transport part, the tracks converging at the junction where the at least one intrabay transport part is joined to the at least one interbay part.

27. The system according to claim 26, wherein the at least one intrabay transport part has other multiple tracks converging at the junction.

28. The system according to claim 26, wherein at least one of the tracks is dedicated for allowing travel of transport vehicles in a single direction along the at least one interbay transport part, and another of the tracks is dedicated for allowing travel of transport vehicles in an opposite direction along the at least one interbay transport part.

29. The system according to claim 21, further comprising a set of storage areas, interbay transport parts and intrabay transport parts, wherein the storage area, the at least one interbay transport part and the at least one intrabay transport part form a subset from the set and provide a transport circuit between the storage area and at least one of the processing bays, and wherein the transport circuit is substantially independent of another transport circuit provided by another subset comprising another storage area, another interbay transport part and another intrabay transport part.

30. An automated material handling system for a semiconductor fabrication facility, the system comprising:
a first segment comprising semiconductor panel holder storage, a first interbay transport section, and a first intrabay transport section connected to each other for forming a first transport circuit allowing transport of semiconductor panel holders forth and back between the semiconductor panel holder storage and at least one fabrication bay of the fabrication facility; and
a second segment comprising other semiconductor panel holder storage, a second interbay transport section, and a second intrabay transport section connected to each other for forming a second transport circuit independent from the first transport circuit;

wherein the first segment is arranged to allow one or more of the other semiconductor panel holder storage, second interbay transport section, and second intrabay transport section of the second segment to be connected to the first segment when the first segment is available for use in the fabrication facility.

* * * * *